(12) United States Patent
Kim

(10) Patent No.: US 8,471,974 B2
(45) Date of Patent: Jun. 25, 2013

(54) ARRAY SUBSTRATE, DISPLAY PANEL HAVING THE SAME AND METHOD OF MANUFACTURING THE SAME

(75) Inventor: Dong-Gyu Kim, Yongin-si (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 1469 days.

(21) Appl. No.: 12/105,015

(22) Filed: Apr. 17, 2008

(65) Prior Publication Data
US 2008/0297675 A1    Dec. 4, 2008

(30) Foreign Application Priority Data

Jun. 4, 2007  (KR) .................. 10-2007-0054279

(51) Int. Cl.
*G02F 1/136*   (2006.01)
*G02F 1/1343*  (2006.01)

(52) U.S. Cl.
USPC ............................................ 349/48; 349/139

(58) Field of Classification Search
USPC .................... 349/38, 39, 144, 43, 139, 48
See application file for complete search history.

(56) References Cited

U.S. PATENT DOCUMENTS

| | | | | |
|---|---|---|---|---|
| 5,414,547 A | * | 5/1995 | Matsuo et al. | 349/44 |
| 5,905,548 A | * | 5/1999 | Shimada | 349/38 |
| 6,100,954 A | * | 8/2000 | Kim et al. | 349/138 |
| 7,750,999 B2 | * | 7/2010 | Park | 349/110 |
| 2005/0036091 A1 | * | 2/2005 | Song | 349/129 |
| 2006/0250537 A1 | * | 11/2006 | Lee | 349/43 |
| 2007/0057297 A1 | * | 3/2007 | Kim | 257/291 |
| 2008/0024689 A1 | * | 1/2008 | Ahn | 349/43 |

FOREIGN PATENT DOCUMENTS

| | | |
|---|---|---|
| JP | 11-167127 | 6/1999 |
| JP | 2000-171830 | 6/2000 |
| KR | 1020060121720 | 11/2006 |

OTHER PUBLICATIONS

English Abstract for Publication No. 11-167127.
English Abstract for Publication No. 2000-171830.
English Abstract for Publication No. 1020060121720.

* cited by examiner

*Primary Examiner* — Edward Glick
*Assistant Examiner* — David Chung
(74) *Attorney, Agent, or Firm* — F. Chau & Associates, LLC

(57) ABSTRACT

An array substrate includes first and second gate lines, a data line, a pixel electrode, a shield electrode, a first driving transistor, a second driving transistor and a voltage-varying transistor. The pixel electrode has first and second pixel parts spaced apart from each other. The shield electrode covers a peripheral area of the pixel electrode. Each of the first and second driving transistors is electrically connected to the first and second pixel parts, respectively. The voltage-varying transistor includes a voltage-varying drain electrode having a shield-overlapping part overlapping the shield electrode. The voltage-varying transistor is electrically connected to the second gate line and the second pixel part. The voltage-varying drain electrode of the voltage-varying transistor overlaps the shield electrode to define a voltage-decreasing capacitor. The voltage difference between the first and second pixel parts of the pixel electrode may be increased.

29 Claims, 9 Drawing Sheets

ARRAY SUBSTRATE, DISPLAY PANEL HAVING THE SAME AND METHOD OF MANUFACTURING THE SAME

CROSS-REFERENCE TO RELATED APPLICATION

This application claims priority under 35 U.S.C. §119 to Korean Patent Application No. 10-2007-0054279 filed on Jun. 4, 2007 in the Korean Intellectual Property Office (KIPO), the contents of which are herein incorporated by reference in their entirety.

BACKGROUND OF THE INVENTION

1. Technical Field

The present invention relates to an array substrate. More particularly, the present invention relates to an array substrate, a display panel having the array substrate, and a method for manufacturing the array substrate.

2. Discussion of the Related Art

Generally, a liquid crystal display (LCD) device includes an LCD panel that displays an image by adjusting a light-transmitting ratio of liquid crystal molecules, and a backlight assembly disposed below the LCD panel to provide the LCD panel with light.

The LCD panel includes an array substrate, a color filter substrate and a liquid crystal layer. The array substrate includes a plurality of signal lines, a plurality of thin-film transistors (TFTs) and a plurality of pixel electrodes. The color filter substrate faces the array substrate and has a common electrode. The liquid crystal layer is interposed between the array substrate and the color filter substrate.

The array substrate includes a gate line, a data line, a driving transistor and a transparent pixel electrode. The gate line is formed along a first direction. The data line is formed along a second direction, substantially perpendicular to the first direction, to define a unit area. The driving transistor is electrically connected to the gate line and the data line. The transparent pixel electrode formed in the unit area is electrically connected to the driving transistor.

In order to decrease the number of data lines, the pixel electrode may have an extended shape in which its width the second direction is longer than its length in the first direction. Here, the array substrate may further include a storage line formed along the second direction to be overlapped with the pixel electrode.

The pixel electrode may further include first and second pixel parts receiving first and second voltages. The first and second voltages are different from each other. The first and second pixel parts are spaced apart from each other to increase a viewing angle of an image. Here, the array substrate may further include a voltage-varying transistor for increasing the difference between the first and second voltages. For example, a drain electrode of the voltage-varying transistor is overlapped with the storage line in order to increase the difference between the first and second voltages.

However, the storage line is formed across a central portion of the pixel electrode, so that a drain electrode of the voltage-varying transistor does not overlap the storage line.

SUMMARY OF THE INVENTION

Exemplary embodiments of the present invention provide an array substrate capable of increasing a voltage difference of a pixel electrode.

Exemplary embodiments of the present invention provide a display panel having the above-mentioned array substrate.

Exemplary embodiments of the present invention provide a method for manufacturing the above-mentioned array substrate.

In one aspect of the present invention, an array substrate includes first and second gate lines, a data line, a pixel electrode, a shield electrode, a first driving transistor, a second driving transistor and a voltage-varying transistor.

The first and second gate lines are formed along a first direction. The data line is formed along a second direction crossing the first direction. The pixel electrode has first and second pixel parts spaced apart from each other. The shield electrode is formed to cover a peripheral area of the pixel electrode. The first driving transistor is electrically connected to the first gate line and the data line. The first driving transistor is electrically connected to the first pixel part. The second driving transistor is electrically connected to the first gate line and the data line. The second driving transistor is electrically connected to the second pixel part. The voltage-varying transistor includes a voltage-varying drain electrode having a shield-overlapping part overlapped with the shield electrode. The voltage-varying transistor is electrically connected to the second gate line and the second pixel part.

In an exemplary embodiment, the array substrate may further include a passivation layer and an organic insulation layer. The passivation layer may cover the first and second gate lines, the data line, the first and second driving transistors and the voltage-varying transistor and may protect the first and second gate lines, the data line, the first and second driving transistors and the voltage-varying transistor. The organic insulation layer is formed on the passivation layer. The pixel electrode and the shield electrode are formed on the organic insulation layer.

In an exemplary embodiment, the array substrate may further include a protecting layer formed between the pixel electrode and the organic insulation layer, or formed between the shield electrode and the organic insulation layer. Here, the organic insulation layer may include a color filter for displaying a color.

In an exemplary embodiment, the shield-overlapping part may overlap the shield electrode to define a voltage-decreasing capacitor, and a shield-overlapping hole may be formed in the organic insulation layer corresponding to the shield-overlapping part to increase a capacitance value of the voltage-decreasing capacitor.

In an exemplary embodiment, the voltage-varying drain electrode may further include a central pixel overlapping part overlapping the first pixel part to define a voltage-increasing capacitor between the first pixel part and the central pixel overlapping part. A central pixel overlapping hole may be formed in the organic insulation layer corresponding to the central pixel overlapping part and a capacitance value of the voltage-increasing capacitor may be increased.

In another aspect of the present invention, a display panel includes an array substrate, an opposite substrate, and a liquid crystal layer. The opposite substrate is opposite to the array substrate. The liquid crystal layer is interposed between the array substrate and the opposite substrate.

The array substrate includes first and second gate lines, a data line, a pixel electrode, a shield electrode, a first driving transistor, a second driving transistor and a voltage-varying transistor. The first and second gate lines are formed along a first direction. The data line is formed along a second direction crossing the first direction. The pixel electrode has first and second pixel parts spaced apart from each other. The shield electrode is formed to cover a peripheral area of the pixel electrode. The first driving transistor is electrically connected to the first gate line and the data line. The first driving transistor is electrically connected to the first pixel part. The second driving transistor is electrically connected to the first gate line and the data line. The second driving transistor is electrically connected to the second pixel part. The voltage-varying transistor includes a voltage-varying drain electrode having a shield-overlapping part overlapped with the shield electrode. The voltage-varying transistor is electrically connected to the second gate line and the second pixel part.

In an exemplary embodiment, the opposite substrate may include a common electrode including a transparent conductive material. The common electrode receives a common voltage. The shield electrode also receives the common voltage.

In an aspect of the present invention, in manufacturing an array substrate, a thin-film transistor (TFT) layer is formed. The TFT layer includes first and second gate lines formed along a first direction, a data line formed along a second direction crossing the first direction, first and second driving transistors electrically connected to the first gate line and the data line, and a voltage-varying transistor electrically connected to the second gate line. Then, a pixel electrode is formed. The pixel electrode includes a first pixel electrode part electrically connected to the first driving transistor, and second pixel electrode part spaced apart from the first pixel part. The second pixel electrode is electrically connected to the second driving transistor and the voltage-varying transistor. Then, a shield electrode covering a peripheral area of the pixel electrode is formed. The shield electrode overlaps a portion of the voltage-varying drain electrode of the voltage-varying transistor. Here, the shield electrode and the pixel electrode may be simultaneously formed.

In an exemplary embodiment, in manufacturing the TFT layer, a central pixel overlapping part overlaping the first pixel part may be formed. The central pixel overlapping part may be electrically connected to a portion of the voltage-varying drain electrode.

In an exemplary embodiment, a passivation layer covering the TFT layer may further be formed to protect the TFT layer, and then an organic insulation layer may be formed on the passivation layer. Selectively, a protecting layer covering the organic insulation layer may be formed to protect the organic insulation layer. Here, the pixel electrode and the shield electrode may be formed on the organic insulation layer or on the protecting layer.

In an exemplary embodiment, in order to manufacture the organic insulation layer, the organic insulation layer may be formed on the passivation layer, and then a shield overlap hole may be formed by removing a portion of the organic insulation layer corresponding to a portion of the voltage-varying drain electrode.

According to an exemplary embodiment of the present invention, the voltage-varying drain electrode of the voltage-varying transistor overlaps the shield electrode to define a voltage-decreasing capacitor. Accordingly, the voltage difference between the first and second pixel parts of the pixel electrode may be increased.

BRIEF DESCRIPTION OF THE DRAWINGS

The above and other features and aspects of exemplary embodiments of the present invention will become readily apparent by reference to the following detailed description when considered in conjunction with the accompanying drawings wherein.

DETAILED DESCRIPTION OF EXEMPLARY EMBODIMENTS

Figure 1:
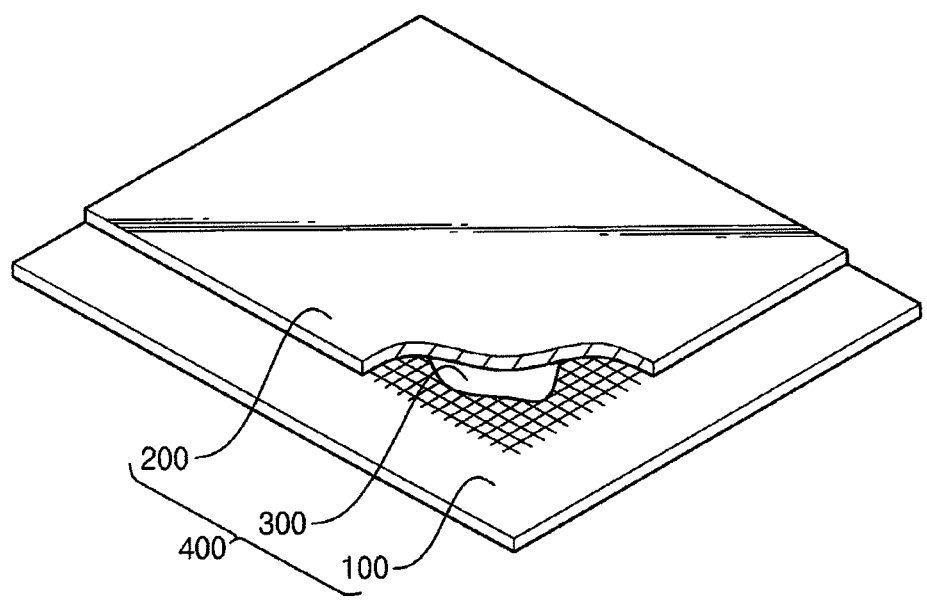
FIG. 1 is a perspective view illustrating a display panel according to an exemplary embodiment of the present invention.

Exemplary embodiments of the present invention are described more fully below with reference to the accompanying drawings. This invention may, however, be embodied in many different forms and should not be construed as limited to the embodiments set forth herein. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numbers may refer to like elements throughout. Embodiments of the present invention are described in detail below with reference to the accompanying drawings.

FIG. 1 is a perspective view illustrating a display panel according to an exemplary embodiment of the present invention.

Referring to FIG. 1, a display panel 400 according to an exemplary embodiment of the present invention includes an array substrate 100, an opposite substrate 200 and a liquid crystal layer 300. The display panel 400 displays an image using light.

The array substrate 100 includes a plurality of pixel electrodes disposed in a matrix. A plurality of thin film transistors TFTs applies a driving voltage to each of the pixel electrodes. A plurality of signal lines drives the TFTs.

The opposite substrate 200 is disposed to face the array substrate 100. The opposite substrate 200 may include a common electrode formed thereon. The common electrode may include an optically transparent and electrically conductive material.

The liquid crystal layer 300 is interposed between the array substrate 100 and the opposite substrate 200. Therefore, when an electric field is applied to the liquid crystal layer 300, an arrangement of liquid crystal molecules of the liquid crystal layer 300 is altered to change optical transmissivity, so that an image is displayed.

Figure 2:
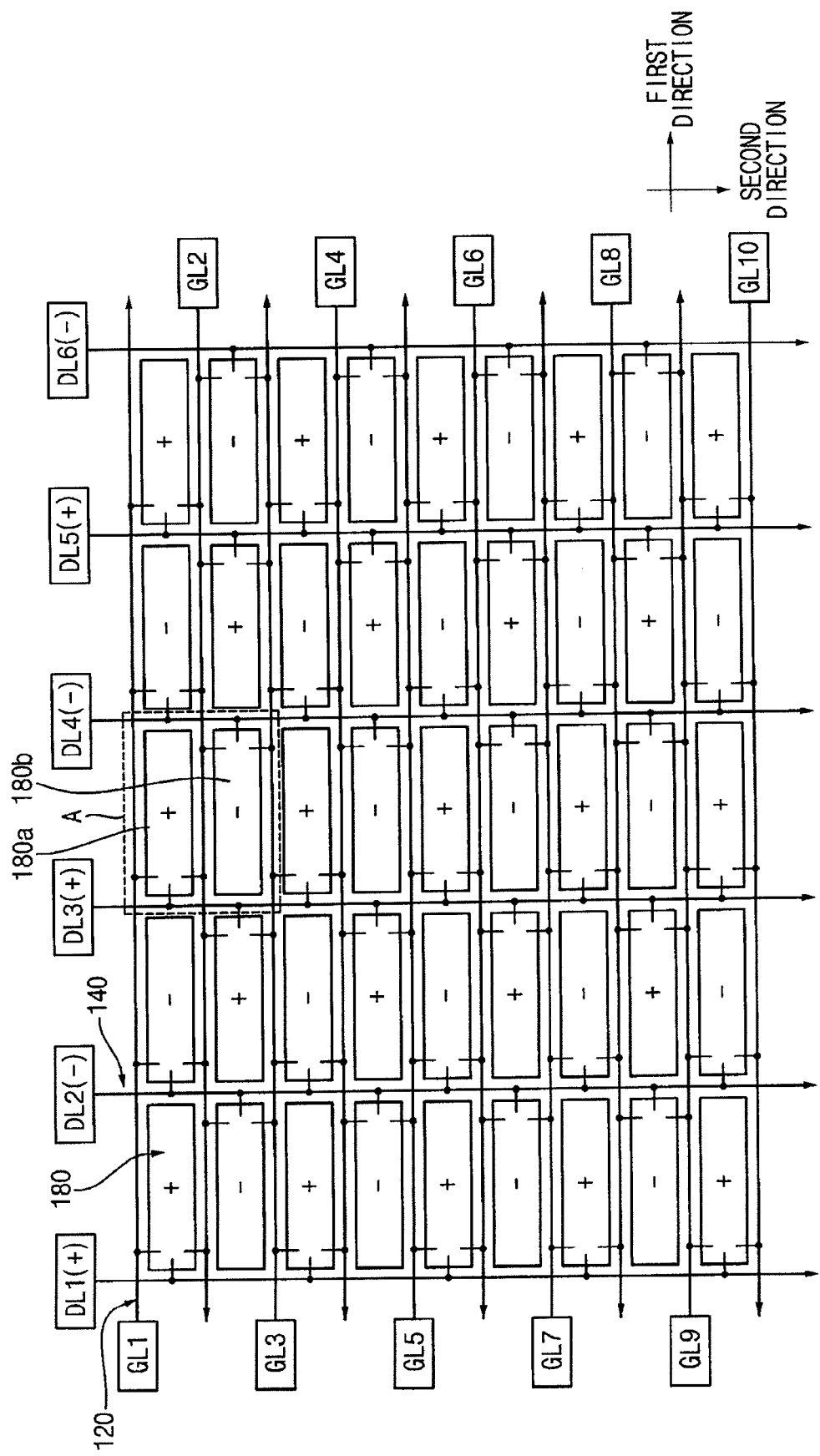
FIG. 2 is a plan view schematically illustrating the array substrate of FIG. 1.

FIG. 2 is a plan view schematically illustrating the array substrate of FIG. 1.

Referring to FIGS. 1 and 2, the array substrate 100 includes a plurality of gate lines 120, a plurality of data lines 140 and a plurality of pixel electrodes 180.

The gate lines 120 are formed along a first direction, and the data lines 140 are formed along a second direction crossing the first direction. The second direction may be substantially perpendicular to the first direction.

For example, the gate lines 120 include a first gate line GL1, a second gate line GL2, a third gate line GL3, a fourth gate line GL4, a fifth gate line GL5, a sixth gate line GL6, a seventh gate line GL7, a eighth gate line GL8, a ninth gate line GL9, and a tenth gate line GL10. The data lines 140 include a first data line DL1, a second data line DL2, a third data line DL3, a fourth data line DL4, a fifth data line DL5, and a sixth data line DL6.

The first to tenth gate lines GL1 to GL10 are electrically connected to a gate driving section (not shown) to receive a plurality of gate signals, and the first to sixth data lines DL1 to DL6 are electrically connected to a data driving section (not shown) to receive a plurality of data signals.

The gate driving section may include a left gate driving section (not shown) and a right gate driving section (not shown). The left driving section is electrically connected to a left portion of the odd-numbered gate lines GL1, GL3, GL5, GL7 and GL9 that are formed along an odd row. The right driving section is electrically connected to a right portion of the even-numbered gate lines GL2, GL4, GL6, GL8 and GL10 that are formed along the even rows. Alternatively, the gate driving section may be electrically connected to an end portion of the gate lines GL1, GL2, . . . , GL9 and GL10.

The first to tenth gate lines GL1, GL2, . . . , GL9 and GL10 and the first to sixth data lines DL1, DL2, . . . , DL5 and DL6 cross each other, so that a plurality of unit pixels may be defined on the array substrate 100. A plurality of pixel electrodes 180 are formed on the each of the unit pixels, so that the pixel electrodes 180 are disposed in a matrix. Each of the unit pixels may have a rectangular shape extended in a first direction. As a result, the pixel electrodes 180 formed on each of the unit pixels may be extended in the first direction. For example, the pixel electrodes 180 have a rectangular shape extended in the first direction.

Electrical connections between the first to third gate lines GL1, GL2 and GL3, and the third and fourth data lines DL3 and DL4 is described in detail in order to explain the electrical connections among the gate lines 120, the data lines 140 and the pixel electrodes 180.

The pixel electrode 180 includes a first pixel electrode 180a and a second pixel electrode 180b. The first pixel electrode 180a is formed in a unit area defined by the first and second gate lines GL1 and GL2, and the third and fourth data lines DL3 and DL4. The second pixel electrode 180b is formed in a unit area defined by the second and third gate lines GL2 and GL3, and the third and fourth data lines DL3 and DL4.

The first gate line GL1 is electrically connected to the first pixel electrode 180a, and the second gate line GL2 is electrically connected to the first and second pixel electrodes 180a and 180b. The third gate line GL3 is electrically connected to the second pixel electrode 180b. The third data line DL3 is electrically connected to the first pixel electrode 180a, and the fourth data line DL4 is electrically connected to the second pixel electrode 180b.

A plurality of data signals for a vertical inversion may be applied to the each of the first through sixth data lines DL1 to DL6. For example, during one frame interval, a positive data signal is applied to a predetermined data line, and a negative data signal is applied to a data line that is adjacent to the predetermined data line. Alternatively, during a following frame interval, a negative data signal is applied to the predetermined data line, and a positive data signal is applied to the adjacent data line. Consequently, each of the pixel electrodes 180 that are arranged in a matrix may have a dot inverted along the first and second directions.

For example, the second to fourth data lines DL2, DL3 and DL4 as a description for the data signals applied to the first to sixth data lines DL1, DL2, DL3, DL4, DL5 and DL6 will be described.

During a first frame, a negative data signal is applied to the second data line DL2, a positive data signal is applied to the third data line DL3, and a negative data signal is applied to the fourth data line DL4. Then, during a second frame following to the first frame, a positive data signal is applied to the second data line DL2, a negative data signal is applied to the third data line DL3, and a positive data signal is applied to the fourth data line DL4.

As a result, the data signal applied to the first to sixth data lines DL1, DL2, DL3, DL4, DL5A and DL6 may have a dot inverted by each frame.

Figure 3:
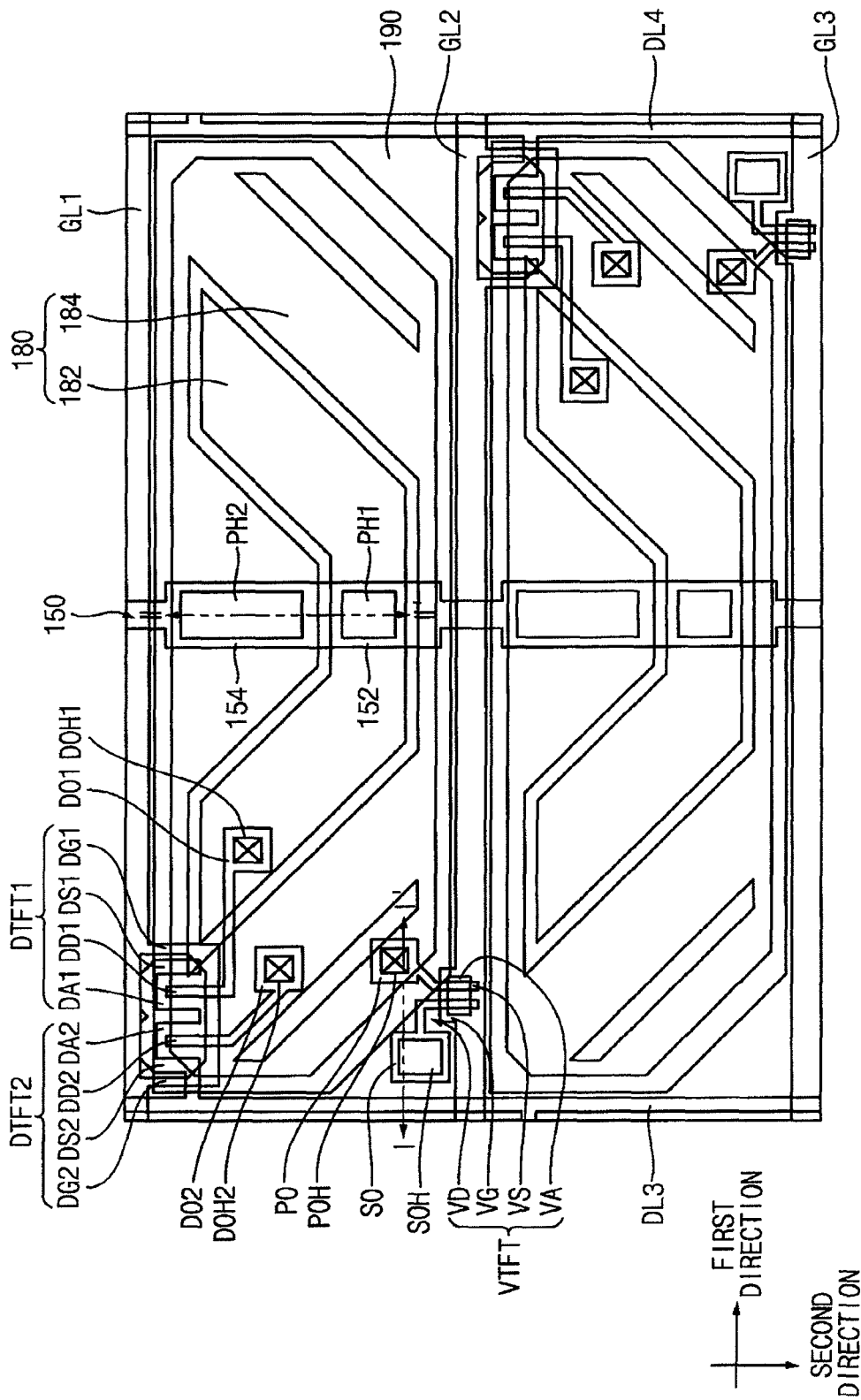
FIG. 3 is an enlarged plan view illustrating a portion "A" in FIG. 2.
Figure 4:
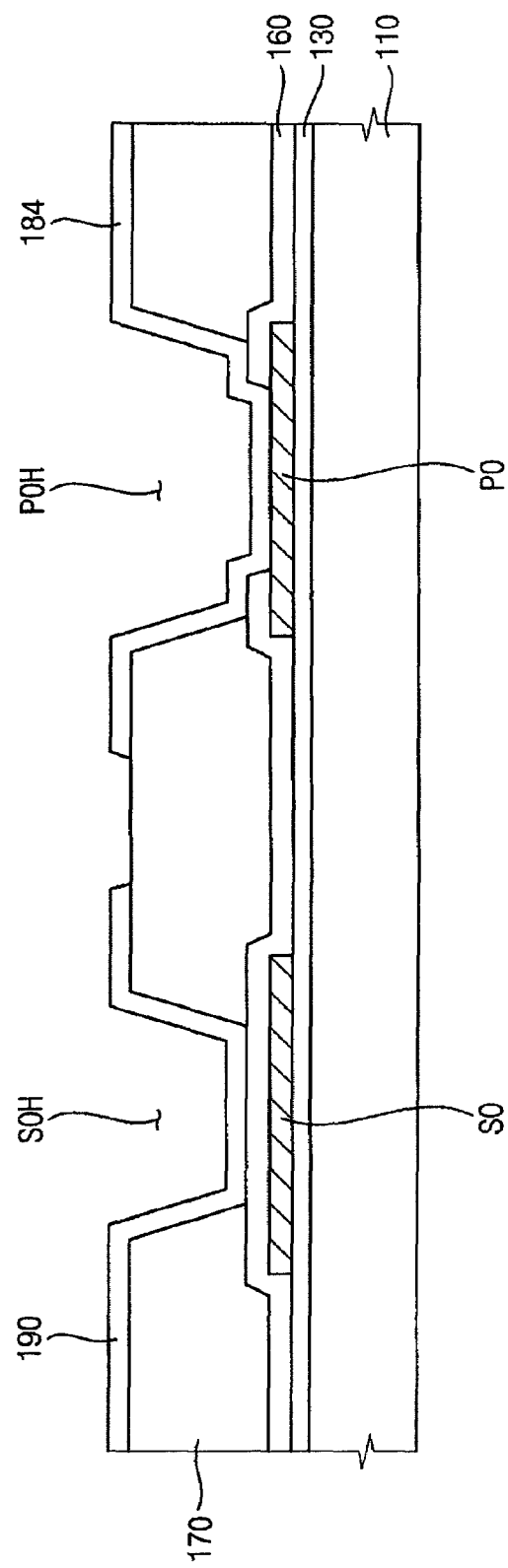
FIG. 4 is a cross-sectional view taken along a line I-I' of FIG. 3.
Figure 5:
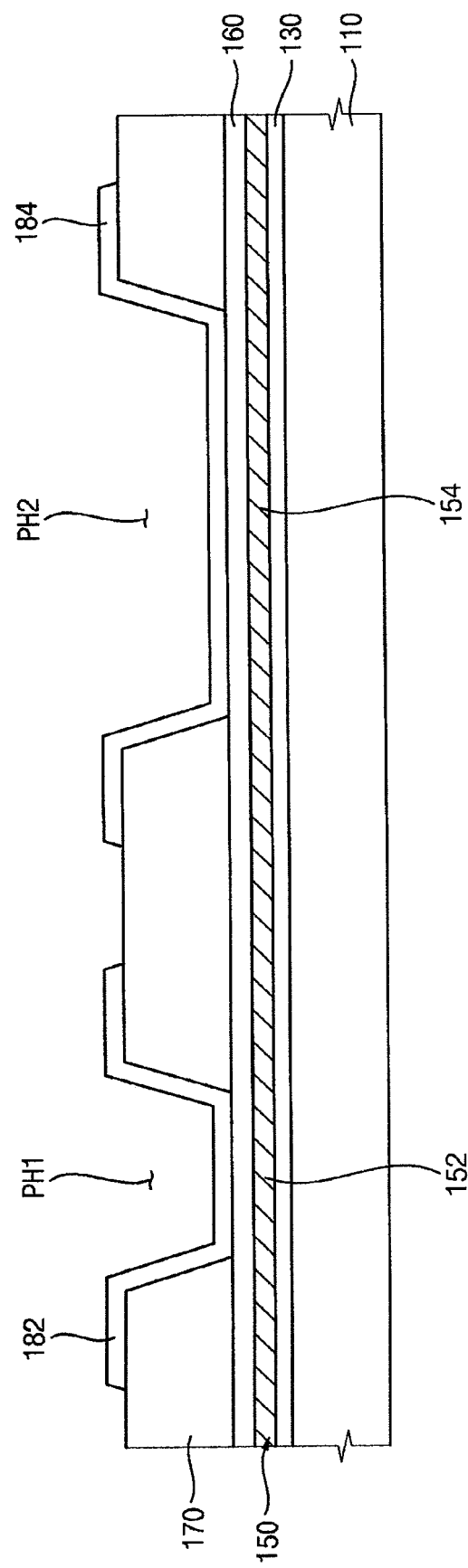
FIG. 5 is a cross-sectional view taken along a line II-II' of FIG. 3.

FIG. 3 is an enlarged plan view illustrating a portion "A" in FIG. 2. FIG. 4 is a cross-sectional view taken along a line I-I' of FIG. 3. FIG. 5 is a cross-sectional view taken along a line II-II' of FIG. 3.

Referring to FIGS. 1 to 5, the array substrate 100 includes a base substrate 110, a gate line 120, a gate insulation layer 130, a data line 140, a storage line 150, a passivation layer 160, an organic insulation layer 170, a pixel electrode 180, a shield electrode 190, a first driving transistor DTFT1, a second driving transistor DTFT2 and a voltage-varying transistor VTFT.

The base substrate 110 has a plate shape. The base substrate 110 includes a transparent material such as glass, quarts, synthetic resin, etc.

A plurality of the gate lines 120 are formed on the base substrate 110 in the first direction. For example, the gate lines 120 include the first, second and third gate lines GL1, GL2 and GL3 that are adjacent to each other.

The gate insulation layer 130 is formed on the base substrate 110 to cover the gate line 120. The gate insulation layer 130 may include an inorganic insulation. For example, the gate insulation layer 130 includes a silicon nitride layer (SiNx) and a silicon oxide layer (SiOx).

A plurality of the data lines 140 are formed on the gate insulation layer 130 in the second direction. For example, the data lines 140 include the third and fourth data lines DL3 and DL4 that are adjacent to each other.

A plurality of the storage lines 150 are formed on the gate insulation layer 130 to be separated apart from the data line 140 along the second direction. A detail description of the storage line 150 will be described.

The passivation layer 160 is formed on the gate insulation layer 130 to cover the data line 140 and the storage line 150. The passivation layer 160 includes, for example, a silicon nitride layer (SiNx) and a silicon oxide layer (SiOx).

The organic insulation layer 170 is formed on the passivation layer 160. A thickness of the organic insulation layer 170 is greater than a thickness of the passivation layer 160. For example, the thickness of the organic insulation layer 170 may be about 2 microns to about 6 microns.

The pixel electrode 180 is formed on the organic insulation layer 170. The pixel electrode 180 may include a material that is optically transparent and electrically conductive. In one exemplary embodiment, the pixel electrode 180 is formed in a unit area defined by the gate line 120 and the data line 140. Alternatively, the pixel 180 may be formed in a unit area defined in another manner.

The pixel electrode 180 includes a first pixel part 182 and a second pixel part 184 that are spaced apart from each other. The second pixel part 184 may cover the first pixel part 182.

For example, the second pixel part 184 may surround an outer side of the first pixel part 182. The first and second pixel parts 182 and 184 have a substantially symmetric shape with respect to an imaginary line that crosses a central portion of the each of unit area along the second direction. Here, the first pixel part 182 may have, for example, a V-shape when viewed on a plane.

The shield electrode 190 is formed on the organic insulation layer 170 to cover a peripheral portion of the pixel electrode 180. For example, the shield electrode 190 is formed on the organic insulation layer 170 on which the pixel electrode 180 is not formed. The shield electrode 190 is formed in an integrated shape and is spaced apart from the pixel electrode 180. The shield electrode 190 may include a material that is optically transparent and electrically conductive.

As described above, the shield electrode 190 has the integrated shape on the organic insulation layer 170 on which the pixel electrode 180 is not formed, so that the gate line 120 and the data line 140 may overlap each other. Thus, an unnecessary capacitor may be generated between the shield electrode 190 and the gate line 120 or the shield electrode 190 and the data line 140. Therefore, in order to minimize a capacitance value of the unnecessary capacitor, the organic insulation layer 170 may be formed with a thickness of about 2 microns or greater.

The first driving transistor DTFT1 is electrically connected to the first gate line GL1 and the third data line DL3, and is electrically connected to the first pixel part 182. For example, the first driving transistor DTFT1 includes a first driving gate electrode DG1, a first driving activation pattern DA1, a first driving source electrode DS1 and a first driving drain electrode DD1. The first driving gate electrode DG1 is electrically connected to the first gate line GL1, and the first driving activation pattern DA1 is overlapped with the first driving gate electrode DG1. The first driving source electrode DS1 is electrically connected to the third data line DL3, and the first driving drain electrode DD1 is electrically connected to the first pixel part 182. Here, the first driving source electrode DS1 may have a U-shape when viewed on a plane.

The second driving transistor DTFT2 is electrically connected to the first gate line GL1 and the third data line DL3, and is electrically connected to the second pixel part 184. For example, the second driving transistor DTFT2 includes a second driving gate electrode DG2, a second driving activation pattern DA2, a second driving source electrode DS2 and a second driving drain electrode DD2. The second driving gate electrode DG2 is electrically connected to the first gate line GL1, and the second driving activation pattern DA2 overlaps the second driving gate electrode DG2. The second driving source electrode DS2 is electrically connected to the third data line DL3, and the second driving drain electrode DD2 is electrically connected to the second pixel part 184. Here, the second driving source electrode DS2 may have a U-shape when viewed on a plane.

The first and second driving transistors DTFT1 and DTFT2 may each be a thin-film transistor and the remaining elements, except for the first and second driving drain electrodes DD1 and DD2, may be integrated with the thin-film transistors.

For example, the first and second driving gate electrode DG1 and DG2 are extended along the second direction from the first gate line GL1 and are integrated with each other. The first and second driving activation patterns DA1 and DA2 are integrated with each other and overlap the first and second driving gate electrodes DG1 and DG2. The first and second driving source electrodes DA1 and DA2 are extended along the first direction from the third data line DL3 and are integrated with each other.

The first and second driving drain electrodes DD1 and DD2 are separated from each other and are covered by the passivation layer 160. For example, the first driving drain electrode DD1 is separated from the first driving source electrode DS1 and overlaps the first driving activation pattern DA1, and is electrically connected to the first pixel part 182. The second driving drain electrode DD2 is spaced apart from the second driving source electrode DS2 and overlaps the second driving activation pattern DA2, and is electrically connected to the second pixel part 184.

The first driving drain electrode DD1 includes a first driving overlapping part DO1 formed on the gate insulation layer 130 overlapping the first pixel part 182. Here, a first driving contact hole DOH1 is formed through on the passivation layer 160 and the organic insulation layer 170 corresponding to the first driving overlapping part DO1. The first driving contact hole DOH1 may electrically contact the first pixel part 182 to the first driving overlapping part DO1.

The second driving drain electrode DD2 includes a second driving overlapping part DO2 formed on the gate insulation layer 130 to be overlapped with the second pixel part 184. Here, a second driving contact hole DOH2 is formed through the passivation layer 160 and the organic insulation layer 170 corresponding to the second driving overlapping part DO2. The second driving contact hole DOH2 may electrically contact the second pixel part 184 to the second driving overlapping part DO2.

The voltage-varying transistor VTFT is electrically connected to the second gate line GL2 and the second pixel part 184. A portion of the voltage-varying transistor VTFT overlaps the shield electrode 190. For example, the voltage-varying transistor VTFT includes a voltage-varying gate electrode VG, a voltage-varying activation pattern VA, a voltage-varying source electrode VS and a voltage-varying drain electrode VD.

The voltage-varying gate electrode VG is extended toward the first gate line GL1 from the second gate line GL2. The voltage-varying activation pattern VA is formed on the gate insulation layer 130 and overlaps the voltage-varying gate electrode VG. The voltage-varying source electrode VS is formed on the gate insulation layer 130 and overlaps the voltage-varying activation pattern VA, and is electrically connected to the second pixel part 184. The voltage-varying drain electrode VD is formed on the gate insulation layer 130 and overlaps the voltage-varying activation pattern VA. The voltage-varying drain electrode VD is spaced apart from the voltage-varying source electrode VS, and overlaps the shield electrode 190.

The voltage-varying source electrode VS includes a peripheral pixel overlapping part PO formed on the gate insulation layer 130 overlapping the second pixel part 184. Here, a peripheral pixel contact hole POH for electrically contacting the second pixel part 184 to the peripheral pixel overlapping part PO is formed in the peripheral pixel overlapping part PO and the passivation layer 160 corresponding to the peripheral pixel overlapping part PO.

The voltage-varying drain electrode VD includes a shield-overlapping part SO. The shield-overlapping part SO is formed on the gate insulation layer 130 and overlaps the shield electrode 190 to define a voltage-decreasing capacitor between the shield electrodes 190. Here, a shield-overlapping hole SOH for increasing a capacitance value of the voltage-decreasing capacitor is formed in the organic insulation layer 170 corresponding to the shield-overlapping part SO. For example, a gap between the shield-overlapping part SO and the shield electrode 190 is decreased by the shield-overlapping hole SOH, and a capacitance value of the voltage-decreasing capacitor may be increased.

Here, the first driving transistor DTFT1, the second driving transistor DTFT2 and the voltage-varying transistor VTFT may be alternately formed along the second direction with respect to at least one of the data lines 140.

The storage line 150 is described in detail below. The storage line 150 may be formed along the imaginary line that crosses a central portion of the each of the unit areas along the second direction. For example, the storage line 150 may be formed to cross the central portion of the pixel electrode 180 along the second direction.

The storage line 150 includes a first pixel overlapping part 152 and a second pixel overlapping part 154. The first pixel overlapping part 152 overlaps the first pixel part 182 to define a first storage capacitor. The second overlapping part 154 overlaps the second pixel part 184 to define a second storage capacitor. The first and second pixel overlapping parts 152 and 154 may have an integrated shape, for example, a rectangular shape.

A first pixel overlapping hole PHI for increasing a capacitance value of the first storage capacitor is formed in the organic insulation layer 170 corresponding to the first pixel overlapping part 152. A second pixel overlapping hole PH2 for increasing a capacitance value of the second storage capacitor is formed in the organic insulation layer 170 corresponding to the second pixel overlapping part 154.

Figure 6:
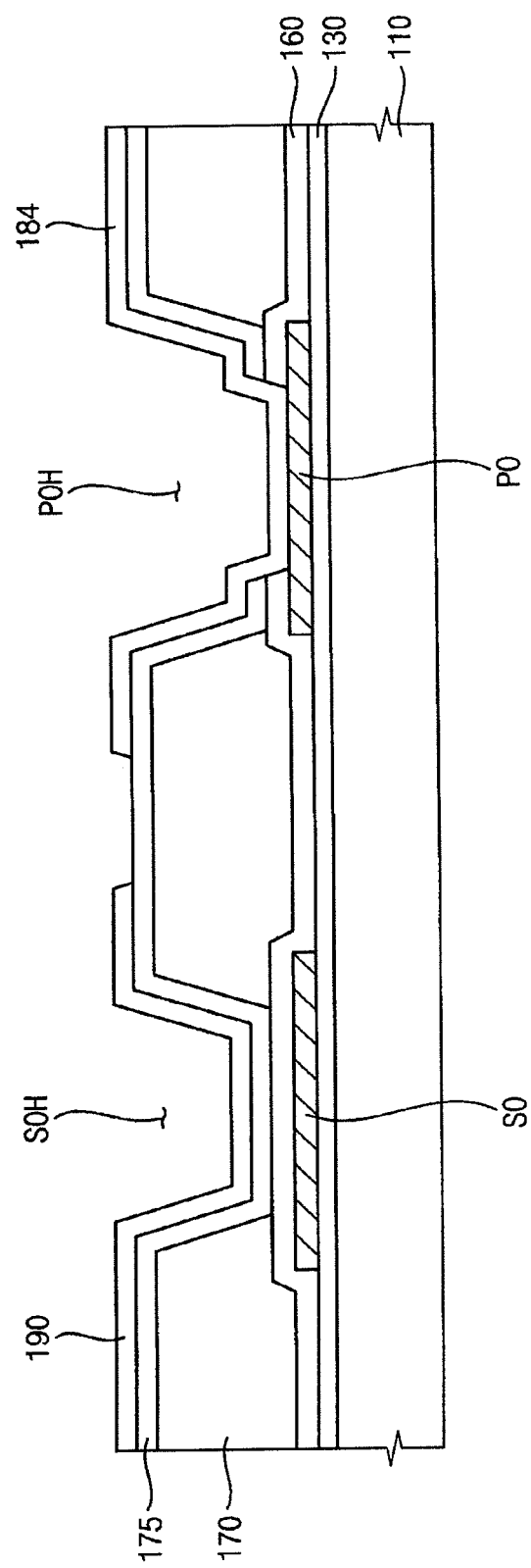
FIG. 6 is a cross-sectional view illustrating an exemplary embodiment of the present invention.

FIG. 6 is a cross-sectional view illustrating an exemplary embodiment of the present invention.

Referring to FIGS. 1, 2, 3 and 6, the array substrate 100 may further include a protecting layer 175 covering the organic insulation layer 170 to protect the organic insulation layer 170.

The protecting layer 175 may cover the organic insulation layer 170 to protect the organic insulation layer 170. The protecting layer 175 includes, for example, a silicon nitride layer (SiNx) and a silicon oxide layer (SiOx). The pixel electrode 180 and the shield electrode 190 are formed on the protecting layer 175. The protecting layer 175 is opened to correspond with the first driving contact hole DOH1, the second driving contact hole DOH2 and the peripheral pixel contact hole POH.

The organic insulation layer 170 may include a color filter for displaying a color. The color filter includes, for example, a red color filter, a green color filter, and a blue color filter.

When the organic insulation layer 170 is the color filter, and the pixel electrode 180 and the shield electrode 190 directly contact each other, the pixel electrode 180 and the shield electrode 190 may damage the organic insulation layer 170. Therefore, when the organic insulation layer 170 is the color filter, ed the protecting layer 175 may be used to protect the organic insulation layer 170.

Figure 7:
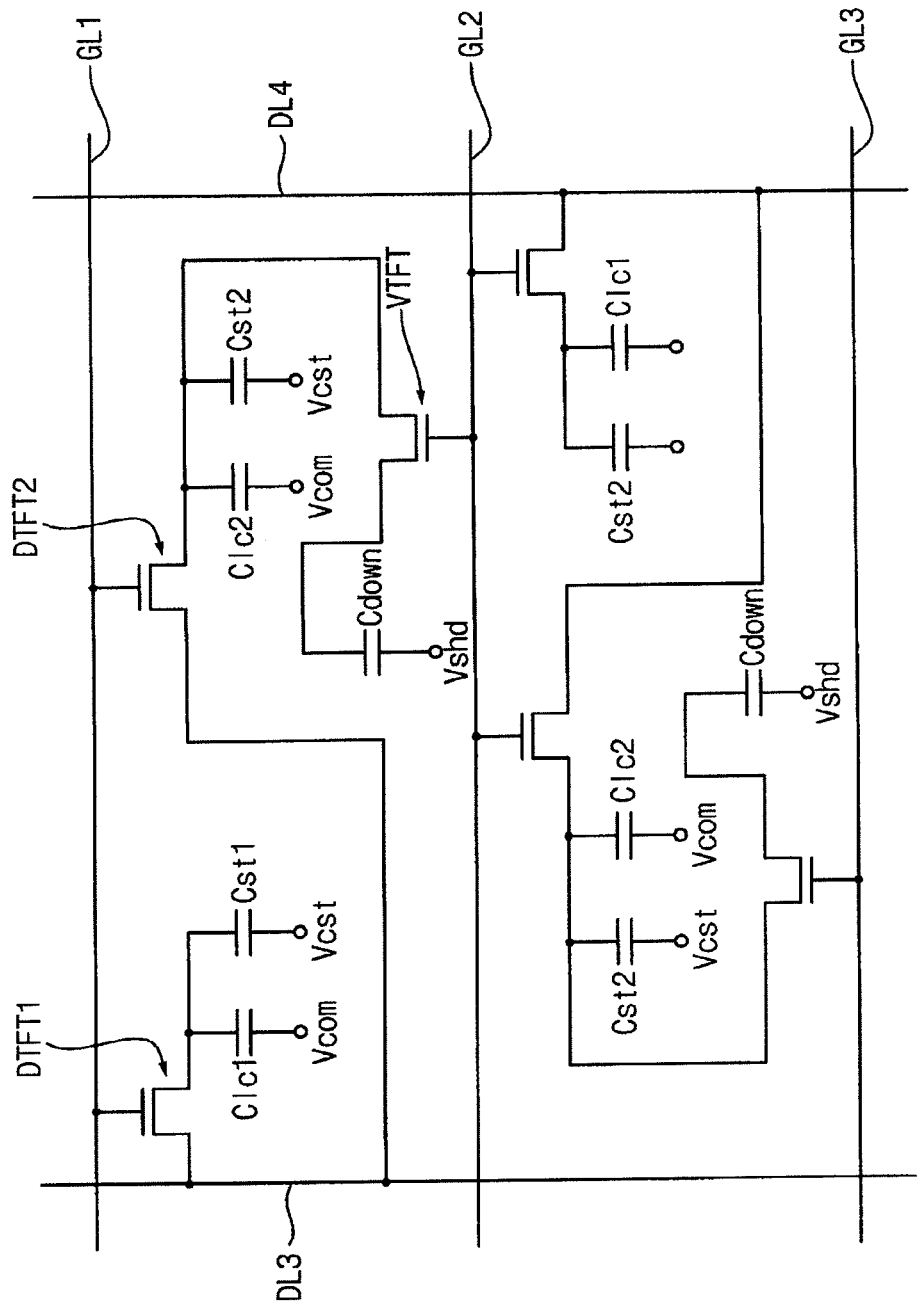
FIG. 7 is a circuit diagram of the elements of FIG. 3.

FIG. 7 is a circuit diagram of the elements of FIG. 3.

Referring to FIG. 7, the first driving transistor DTFT1 includes a gate terminal electrically connected to the first gate line GL1, a source terminal electrically connected to the third data line DL3, and a drain terminal electrically connected to a first terminal of a first liquid crystal capacitor Clc1 and a first terminal of the first storage capacitor Cst1.

The first pixel part 182 and a common electrode of the opposite substrate may define the first liquid crystal capacitor Clc1, and the second pixel part 184 and the storage line 150 may define the first storage capacitor Cst1. Therefore, a common voltage Vcom of the common electrode is applied to a second terminal of the first liquid crystal capacitor Clc1. A reference voltage Vcst of the storage line 150 is applied to a second terminal of the first storage capacitor Cst1. Here, the common voltage Vcom may be substantially equal to the reference voltage Vcst.

The second driving transistor DTFT2 includes a gate terminal electrically connected to the first gate line GL1, a source terminal electrically connected to the third data line DL3, and a drain terminal electrically connected to a first terminal of the second liquid crystal capacitor Clc2 and a first terminal of the second storage capacitor Cst2.

The second pixel part 184 and the common electrode may define the second liquid crystal capacitor Clc2, and the second pixel part 184 and the storage line 150 may define the second storage capacitor Cst2. Therefore, the common voltage Vcom is applied to a second terminal of the second liquid crystal capacitor Clc2, and the reference voltage Vcst is applied to a second terminal of the second storage capacitor Cst2.

The voltage-varying transistor VTFT includes a gate terminal electrically connected to the second gate line GL2. A source terminal is electrically connected to a first terminal of the second liquid crystal capacitor Clc2 and a first terminal of the second storage capacitor Cst2. A drain terminal is electrically connected to a first terminal of the voltage-decreasing capacitor Cdown.

The shield overlapping part SO and the shield electrode 190 may define the voltage-decreasing capacitor Cdown. Therefore, a shield voltage Vshd of the shield electrode 190 is applied to a second terminal of the voltage-decreasing capacitor Cdown. Here, the shield voltage Vshd may be substantially equal to the common voltage Vcom.

In FIG. 7, when a gate signal is applied to the first gate line GL1, the first and second driving transistors DTFT1 and DTFT2 are turned on. Thus, a data signal applied to the third data line DL3 may be applied to the first terminals of the first liquid crystal capacitor Clc1, the first terminal of the first storage capacitor Cst1, a first terminal of the second liquid crystal capacitor Clc2 and a first terminal of the second storage capacitor Cst2. For example, a data signal applied to the third data line DL3 may be charged to the first and second pixel parts 182 and 184 as a first voltage.

Then, when a gate signal is applied to the second gate line GL2, the voltage-varying transistor VTFT is turned on. Thus, the first voltage charged in the second pixel part 184 is applied to a first terminal of the voltage-decreasing capacitor Cdown. Here, a predetermined previous frame voltage applied during a previous frame is applied to a first terminal of the voltage-decreasing capacitor Cdown. The previous frame voltage may have an opposite polarity with respect to the first voltage. Therefore, the first voltage and the previous frame voltage are in the voltage-decreasing capacitor Cdown, so that a second voltage that is lower than the first voltage is generated in the second pixel part 184.

Consequently, the first voltage is applied to the first pixel part 182, and the second voltage that is lower than the first voltage is applied to the second pixel part 184. Therefore, a viewing angle of an image displayed on the display panel may be increased.

Figure 8:
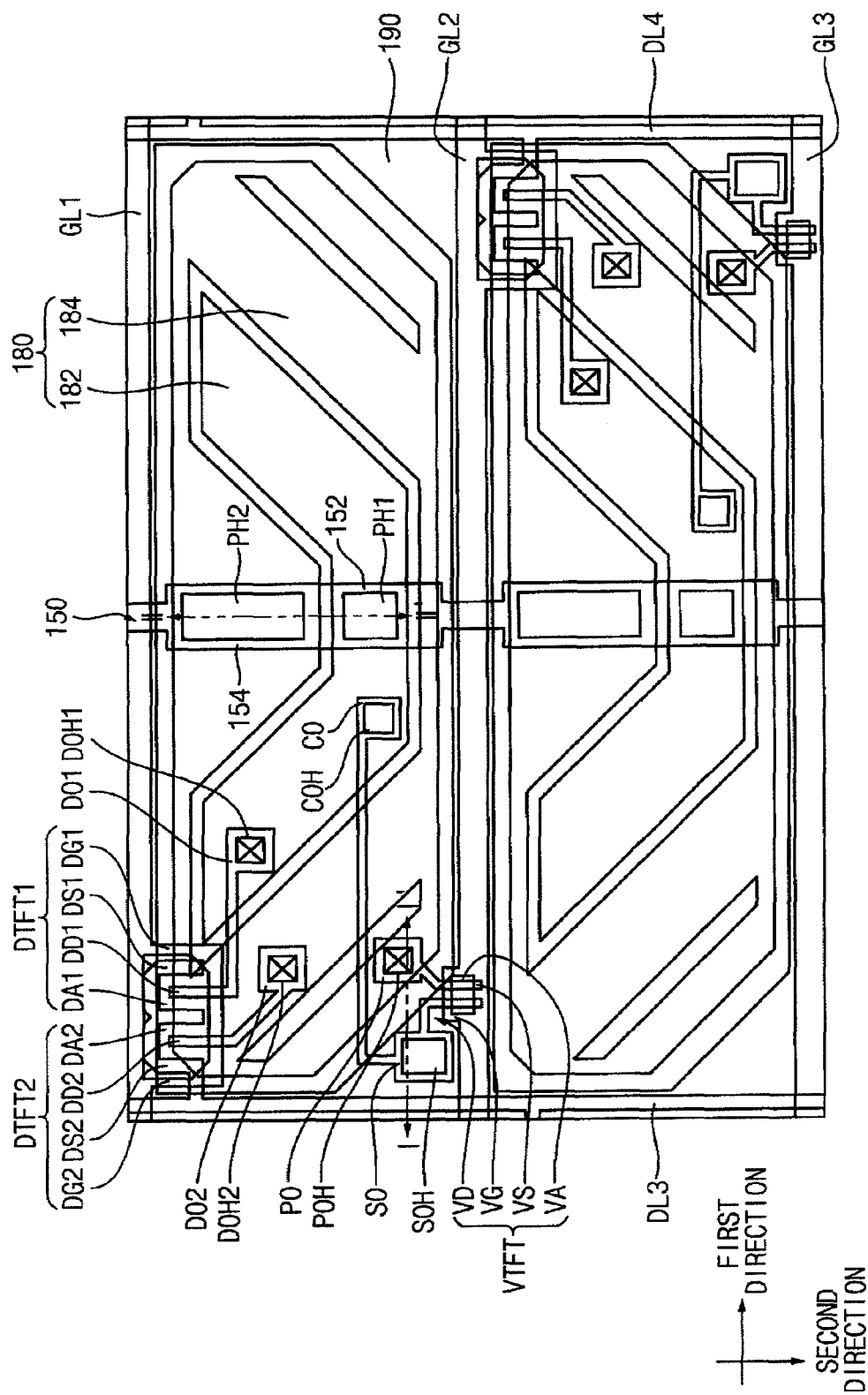
FIG. 8 is a cross-sectional view illustrating an exemplary embodiment of the present invention.
Figure 9:
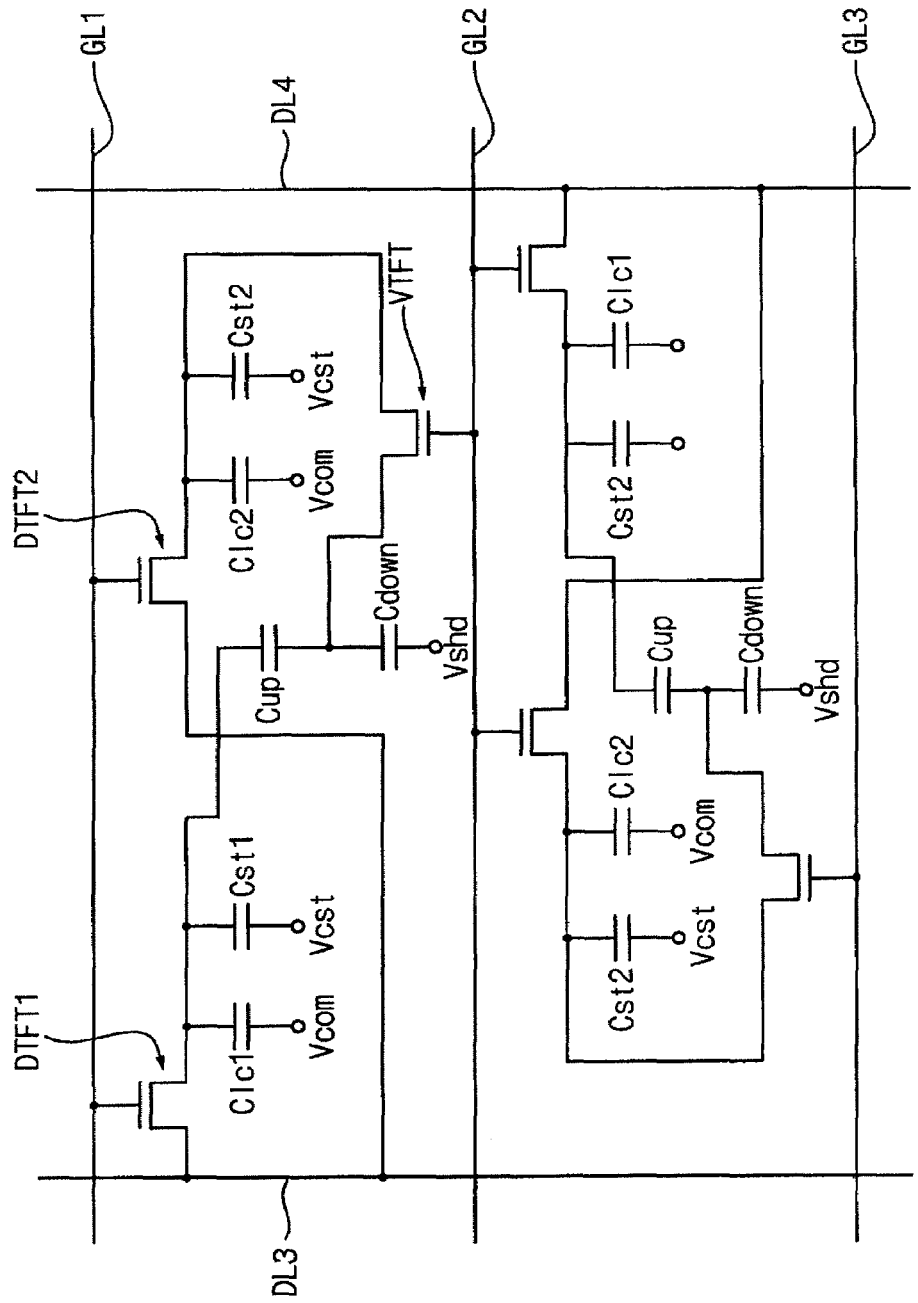
FIG. 9 is a circuit diagram illustrating an electric connection relationship between the elements of FIG. 8.

FIG. 8 is a cross-sectional view illustrating an exemplary embodiment of the present invention. FIG. 9 is a circuit diagram illustrating the elements of FIG. 8.

Referring to FIGS. 1, 2, 8 and 9, the voltage-varying drain electrode VD may further include a central pixel overlapping pat CO that is overlapped with the first pixel part 182.

For example, the central pixel overlapping pat CO is overlapped with the first pixel part 182 to define a voltage-increasing capacitor Cup. The central pixel overlapping pat CO may be directly connected to the shield overlapping part SO.

A central pixel overlapping hole COH may be further formed through the organic insulation layer corresponding to the central pixel overlapping pat CO, which increases a capacitance value of the voltage-increasing capacitor Cup.

The circuit diagram as shown in FIG. 9 is described below.

Referring to FIGS. 7 and 9, a drain terminal of the voltage-varying transistor VTFT is electrically connected to a first terminal of the voltage-increasing capacitor Cup and a first terminal of the voltage-decreasing capacitor Cdown. Here, the voltage-increasing capacitor Cup may be defined by the central pixel overlapping part CO and the first pixel part 182. A second terminal of the voltage-increasing capacitor Cup is electrically connected to a first terminal of the first liquid crystal capacitor Clc1 and a first terminal of the first storage capacitor Cst1. A second terminal of the voltage-varying capacitor Cup is electrically connected to a first terminal of the first capacitor Clc1 and a first terminal of the first storage capacitor Cst1.

When the first and second driving transistors DTFT1 and DTFT2 are turned on based on a gate signal of the first gate line DL1, a data signal applied to the third data line DL3 is applied to a first terminal of the first liquid crystal capacitor Clc1, a first terminal of the second liquid crystal capacitor Clc2 and a first terminal of the second storage capacitor Cst2. For example, a data signal applied to the third data line DL3 may be charged to the first and second pixel parts 182 and 184 as a first voltage.

Then, when a gate signal is applied to the second gate line GL2, the voltage-varying transistor VTFT is turned on. Thus, the first voltage charged in the second pixel part 184 is applied to a first terminal of the voltage-decreasing capacitor Cdown and a first terminal of the voltage-increasing capacitor Cup.

Here, a predetermined previous frame voltage applied during a previous frame is applied to a first terminal of the voltage-decreasing capacitor Cdown. The previous frame voltage may have an opposite polarity with respect to the first voltage. Therefore, the first voltage and the previous frame voltage are in the voltage-decreasing capacitor Cdown. Accordingly, a second voltage that is lower than the first voltage is generated in the second pixel part 184.

As the voltage formed in the first terminal of the voltage-increasing capacitor Cup increases from the previous frame voltage to the second voltage, the voltage formed in the second terminal of the voltage-increasing capacitor Cup may be increased by the difference between the previous frame voltage and the second voltage. For example, the voltage generated in the first pixel part 182 increases from the first voltage to the difference between the previous frame voltage and the second voltage, so that the voltage generated in the first pixel part 182 may be converted into a third voltage.

As a result, the third voltage that is higher than the first voltage is applied to the first pixel part 182, and the second voltage that is lower than the first voltage is applied to the second pixel part 184.

As described above, according to an exemplary embodiment of the present invention, the voltage-varying drain electrode VD overlaps the shield electrode 190 surrounding the pixel electrode (and need not surround the storage line 150), and accordingly, the voltage-decreasing capacitor Cdown may be formed.

When the common voltage Vcom is applied to the shield electrode 190 surrounding a peripheral area of the pixel electrode 180, a light-blocking layer, otherwise formed on the opposite substrate 200 to block light, may be omitted. For example, in a display panel operated as a normally black mode, when the common voltage Vcom is applied to the shield electrode 190, an electric field is not formed between the shield electrode 190 and the common electrode, so that the light may be blocked.

A method for manufacturing the array substrate 100 is described in detail below with reference to the FIGS. 1 to 6.

First, the TFT layer is formed on the base substrate 110. The TFT layer includes the gate line 120, the data line 140, the storage line 150, the first driving transistor DTFT1, the second driving transistor DTFT2, and the voltage-varying transistor VTFT. Here, the first driving transistor DTFT1, the second driving transistor DTFT2 and the voltage-varying transistor VTFT may be defined as TFTs.

A process for manufacturing the TFT layer is described in detail below. A plurality of gate electrodes of the gate line 120 and the TFTs are formed on the base substrate 110.

Then, the gate insulation layer 130 is formed on the base substrate 110 to cover the gate electrodes of the TFTs, and the activation pattern of the TFTs are formed on the gate insulation layer 130 to overlap the gate electrode of the TFTs.

Then, the data line 140, the storage line 150 and the source and drain electrodes of the TFTs are formed on the gate insulation layer 130. Here, the source and drain electrodes of the TFTs are formed to overlap with the activation pattern of the TFTs. The source electrode is spaced apart from the drain electrode.

After the TFT layer is formed, the passivation layer 160 is formed on the TFT layer to protect the TFT layer, and then the organic insulation layer 170 is formed on the passivation layer 160.

After the passivation layer 160 and the organic insulation layer 170 are formed, a portion of the passivation layer 160 and a portion of the organic insulation layer 170 are removed to form the first and second driving contact holes DOH1 and DOH2, the peripheral pixel contact hole POH, the shield overlapping hole SOH and the central pixel overlapping hole COH.

Here, the first and second driving contact holes DOH1 and DOH2 and the peripheral pixel contact hole POH are formed by removing a portion of the passivation layer and a portion of the organic insulation 170, and the shield overlapping hole SOH and the central pixel overlapping hole COH are formed by removing a portion of the organic insulation layer 170.

Then, a transparent electrode layer including an optically transparent and electrically conductive material is formed on the organic insulation layer 170. The transparent electrode layer is then patterned to form the pixel electrode 180 and the shield electrode 190. As described above, the pixel electrode 180 and the shield electrode 190 may be formed from the same processes. Alternatively, the pixel electrode 180 and the shield electrode 190 may be formed from different processes.

For example, the pixel electrode 180 includes the first and second pixel parts 182 and 184 that are spaced apart from each other. The shield electrode 190 is formed to cover a peripheral area of the pixel electrode 180.

The method for manufacturing the array substrate 100 may further include a process for forming the protecting layer 175 that covers the organic insulation layer 170 to protect the organic insulation layer 170. For example, the protecting layer 175 is formed on the organic insulation layer 170, and then the transparent electrode layer may be formed on the protecting layer 175.

As described above, according to exemplary embodiments of the present invention, the voltage-varying drain electrode overlaps the shield electrode surrounding the pixel electrode. The voltage-varying drain electrode need not overlap the storage line. Accordingly, the voltage-decreasing capacitor may be easily formed. Thus, the difference voltage between the first and second voltages that are applied to the first and second pixel parts may be increased.

Moreover, when the common voltage is applied to the shield electrode of the display panel operated in a normally black mode, the light-blocking layer may be omitted from the opposite substrate.

Although exemplary embodiments of the present invention have been described, it is understood that the present invention should not be limited to these exemplary embodiments but various changes and modifications can be made by one ordinary skilled in the art within the spirit and scope of the present invention.

What is claimed is:

1. An array substrate comprising:
    a first gate line and a second gate line formed along a first direction;
    a data line formed along a second direction crossing the first direction;
    a pixel electrode having first and second pixel parts spaced apart from each other;
    a shield electrode covering a peripheral area of the pixel electrode;
    a first driving transistor electrically connected to the first gate line and the data line, the first driving transistor being electrically connected to the first pixel part;
    a second driving transistor electrically connected to the first gate line and the data line, the second driving transistor being electrically connected to the second pixel part; and
    a voltage-varying transistor including a voltage-varying drain electrode having a shield-overlapping part overlapping the shield electrode, the voltage-varying transistor being electrically connected to the second gate line and the second pixel part,
    wherein the pixel electrode and the shield electrode are disposed on a same plane.

2. The array substrate of claim 1, further comprising:
    a passivation layer covering the first and second gate lines, the data line, the first and second driving transistors and the voltage-varying transistor; and
    an organic insulation layer formed between the passivation layer and the pixel electrode, and formed between the passivation layer and the shield electrode.

3. The array substrate of claim 2, wherein the shield electrode overlaps the first gate line, the second gate line and the data line.

4. The array substrate of claim 2, wherein the organic insulation layer comprises a color filter for displaying a color.

5. The array substrate of claim 2, further comprising a protecting layer between the pixel electrode and the organic insulation layer, and between the shield electrode and the organic insulation layer.

6. The array substrate of claim 2, wherein the shield-overlapping part overlaps the shield electrode to define a voltage-decreasing capacitor, and a shield-overlapping hole is formed in the organic insulation layer corresponding to the shield-overlapping part.

7. The array substrate of claim 6, wherein the voltage-varying drain electrode further comprises a central pixel overlapping part overlapping the first pixel part to define a voltage-increasing capacitor between the first pixel part and the central pixel overlapping part, and a shield-overlapping hole formed in the organic insulation layer corresponding to the central pixel overlapping part.

8. The array substrate of claim 2, further comprising a storage line formed along the second direction overlapping the pixel electrode, the storage line being covered by the passivation layer.

9. The array substrate of claim 8, wherein the storage line comprises:
    a first pixel overlapping part overlapping the first pixel part to define a first storage capacitor between the first pixel part and the first pixel overlapping part; and
    a second pixel overlapping part overlapping the second pixel part to define a second storage capacitor between the second pixel part and the second pixel overlapping part.

10. The array substrate of claim 9, wherein a first pixel overlapping hole is formed through the organic insulation layer corresponding to the first pixel overlapping part, and a second pixel overlapping hole is formed through the organic insulation layer corresponding to the second overlapping part.

11. The array substrate of claim 8, wherein the storage line crosses a central portion of the pixel electrode.

12. The array substrate of claim 1, wherein the shield electrode comprises a transparent conductive material.

13. The array substrate of claim 2, wherein a thickness of the organic insulation layer is within the range from about 2 microns to about 6 microns.

14. The array substrate of claim 1, in which the pixel electrode's width extending in the second direction is longer than its length extending in the first direction.

15. The array substrate of claim 1, wherein the second pixel part covers the first pixel part.

16. The array substrate of claim 15, wherein the first and second pixel parts have a substantially symmetric shape with respect to an imaginary line extending along the second direction.

17. The array substrate of claim 15, wherein a first voltage is applied to the first pixel part, and a second voltage that is greater than the first voltage is applied to the second pixel part.

18. The array substrate of claim 1, wherein the voltage-varying transistor comprises:
    a voltage-varying gate electrode electrically connected to the second gate line;
    a voltage-varying activation pattern overlapping the voltage-varying gate electrode; and
    a voltage-varying source electrode electrically connected to the second pixel part.

19. The array substrate of claim 1, wherein the first driving transistor comprises:
    a first driving gate electrode electrically connected to the first gate line;
    a first driving activation pattern overlapping the first driving gate electrode;
    a first driving source electrode electrically connected to the date line; and
    a first driving drain electrode electrically connected to the first pixel part; and
    wherein the second driving transistor comprises:
        a second driving gate electrode electrically connected to the first gate line, the second driving gate electrode being integrated with the first driving gate electrode;
        a second driving activation pattern overlapping the first driving gate electrode, the second driving activation pattern being integrated with the first driving activation pattern;

a second driving source electrode electrically connected to the date line, the second driving source electrode being integrated with the first driving source electrode; and a second driving drain electrode electrically connected to the first pixel part, the second driving drain electrode being spaced apart from the second driving source electrode.

20. The array substrate of claim 1, wherein the first driving transistor, the second driving transistor and the voltage-varying transistor are alternately formed on the data line from a first end portion of the data line to a second portion of the data line along the second direction.

21. A display panel comprising:
an array substrate;
an opposite substrate opposite to the array substrate; and
a liquid crystal layer interposed between the array substrate and the opposite substrate, wherein the array substrate comprises:
  a first gate line and a second gate line formed along a first direction;
  a data line formed along a second direction crossing the first direction;
  a pixel electrode having first and second pixel parts spaced apart from each other;
  a shield electrode covering a peripheral area of the pixel electrode;
  a first driving transistor electrically connected to the first gate line and the data line, the first driving transistor being electrically connected to the first pixel part;
  a second driving transistor electrically connected to the first gate line and the data line, the second driving transistor being electrically connected to the second pixel part; and
  a voltage-varying transistor including a voltage-varying drain electrode having a shield-overlapping part overlapping the shield electrode, the voltage-varying transistor being electrically connected to the second gate line and the second pixel part,
wherein the pixel electrode and the shield electrode are disposed on a same plane.

22. The display panel of claim 21, wherein the opposite substrate comprises a common electrode including a transparent conductive material, wherein the common electrode receives a common voltage.

23. The display panel of claim 22, wherein the shield electrode receives the common voltage.

24. A method for manufacturing an array substrate, the method comprising:
  forming a thin-film transistor (TFT) layer including a first gate line and a second gate line formed along a first direction, a data line formed along a second direction crossing the first direction, a first driving transistor and a second driving transistor electrically connected to the first gate line and the data line, and a voltage-varying transistor electrically connected to the second gate line;
  forming a pixel electrode including a first pixel electrode part electrically connected to the first driving transistor, and second pixel electrode part spaced apart from the first pixel electrode part, the second pixel electrode part being electrically connected to the second driving transistor and the voltage-varying transistor; and
  forming a shield electrode covering a peripheral area of the pixel electrode, the shield electrode overlapping a portion of the voltage-varying drain electrode of the voltage-varying transistor,
wherein the pixel electrode and the shield electrode are disposed on a same plane.

25. The method of claim 24, wherein forming the shield electrode and forming the pixel electrode are performed substantially simultaneously.

26. The method of claim 24, wherein forming the TFT layer comprises forming a central pixel overlapping part overlapping the first pixel part, and the central pixel overlapping part is electrically connected to a portion of the voltage-varying drain electrode.

27. The method of claim 24, further comprising:
  forming a passivation layer covering the TFT layer; and
  forming an organic insulation layer on the passivation layer.

28. The method of claim 27, further comprising: forming a protecting layer covering the organic insulation layer.

29. The method of claim 27, wherein forming the organic insulation layer comprises:
  forming the organic insulation layer on the passivation layer; and
  forming a shield overlap hole by removing a portion of the organic insulation layer corresponding to a portion of the voltage-varying drain electrode.

* * * * *